United States Patent
Leonardo et al.

(10) Patent No.: US 11,398,822 B2
(45) Date of Patent: Jul. 26, 2022

(54) OUTPUT DRIVER WITH REVERSE CURRENT BLOCKING CAPABILITIES

(71) Applicant: ams International AG, Jona (CH)

(72) Inventors: Vincenzo Leonardo, Jona (CH); Camillo Stefanucci, Jona (CH)

(73) Assignee: AMS INTERNATIONAL AG, Jona (CH)

( * ) Notice: Subject to any disclaimer, the term of this patent is extended or adjusted under 35 U.S.C. 154(b) by 0 days.

(21) Appl. No.: 17/287,888

(22) PCT Filed: Oct. 9, 2019

(86) PCT No.: PCT/EP2019/077361
§ 371 (c)(1),
(2) Date: Apr. 22, 2021

(87) PCT Pub. No.: WO2020/083648
PCT Pub. Date: Apr. 30, 2020

(65) Prior Publication Data
US 2021/0399728 A1 Dec. 23, 2021

(30) Foreign Application Priority Data
Oct. 24, 2018 (EP) .................................. 18202384

(51) Int. Cl.
*H02H 3/18* (2006.01)
*H03K 17/687* (2006.01)
(Continued)

(52) U.S. Cl.
CPC ....... *H03K 17/6872* (2013.01); *G06F 13/102* (2013.01); *H02H 3/18* (2013.01);
(Continued)

(58) Field of Classification Search
CPC .......... H03K 17/6872; H03K 17/6874; H03K 19/00315; H03K 2017/066;
(Continued)

(56) References Cited

U.S. PATENT DOCUMENTS 5,160,855 A   11/1992  Dobberpuhl
5,933,027 A    8/1999  Morris et al.
(Continued)

FOREIGN PATENT DOCUMENTS

EP      0874462 A1   10/1998
EP      1246362 A2   10/2002

OTHER PUBLICATIONS

Hong et al., "A Reverse-Voltage Protection Circuit for MOSFET Power Switches", IEEE Journal of Solid-State Circuits, vol. 36, No. 1, Jan. 1, 2001, 4 pages.
(Continued)

*Primary Examiner* — Jung Kim
(74) *Attorney, Agent, or Firm* — MH2 Technology Law Group LLP (57) ABSTRACT

An output driver (1) comprises a driver transistor (MP0) having a gate node (GMP0) to apply a gate control voltage (GCV) and a gate control circuit (30) to control the gate node (GMP0) of the driver transistor (MP0). The output driver (1) is configured to be operable in a first operation mode and a second operation mode, the variable resistance of the current path of the driver transistor (MP0) being lower in the first operation mode than in the second operation mode. The gate control circuit (30) comprises a controllable resistor (RC), the controllable resistor (RC) being disposed between the gate node (GMP0) of the driver transistor (MP0) and an output node (QP) of the output driver (1), and
(Continued)

a resistance of the controllable resistor (RC) being dependent on operating the output driver in the first or second operation mode.

13 Claims, 7 Drawing Sheets

(51) Int. Cl.
    *G06F 13/10*       (2006.01)
    *H03F 1/52*        (2006.01)

(52) U.S. Cl.
    CPC ......... *H03F 1/523* (2013.01); *H03K 17/6874* (2013.01); *H03F 2200/444* (2013.01); *H03K 2217/0018* (2013.01)

(58) Field of Classification Search
    CPC .......... H03K 2217/0018; H03K 17/687; G06F 13/102; H03F 2200/444; H03F 1/523; H02H 3/18
    See application file for complete search history.

(56) References Cited

U.S. PATENT DOCUMENTS

| | | |
|---|---|---|
| 5,963,055 A | 10/1999 | Tanaka et al. |
| 6,320,415 B1 | 11/2001 | Lee |
| 6,628,489 B1 | 9/2003 | Pardoen et al. |
| 8,669,805 B2 | 3/2014 | Serventi et al. |
| 2014/0160600 A1 | 6/2014 | Maggio et al. |

OTHER PUBLICATIONS

International Search Report and Written Opinion in corresponding International Application No. PCT/EP2019/077361 dated Dec. 18, 2021, 18 pages.

FIG 1

Prior Art

FIG 3

Prior Art

OUTPUT DRIVER WITH REVERSE CURRENT BLOCKING CAPABILITIES

CROSS-REFERENCE TO RELATED APPLICATIONS

The present application is the national stage entry of International Patent Application No. PCT/EP2019/077361, filed on Oct. 9, 2019, and published as WO 2020/083648 A1 on Apr. 30, 2020, which claims the benefit of priority of European Patent Application No. 18202384.6, filed on Oct. 24, 2018, all of which are incorporated by reference herein in their entirety.

TECHNICAL FIELD

The disclosure relates to an output driver with reverse current blocking capabilities.

BACKGROUND

An output driver may be provided in a communication device, for example a sensor device, as a 3-wire communication interface to provide an amplified output signal of the communication device. The standards regarding a 3-wire interface of industrial sensors are adapting and evolving according to recent developments in this field. One aspect is that, while in the past the sensors were either configured as NPN or PNP switches, nowadays due to the digitalization, the sensors are increasingly provided with a push-pull output interface, for example in an IO-Link device. This enables new possibilities like operating the push-pull stage as a configurable NPN or PNP stage depending on what is needed.

Figure 1:
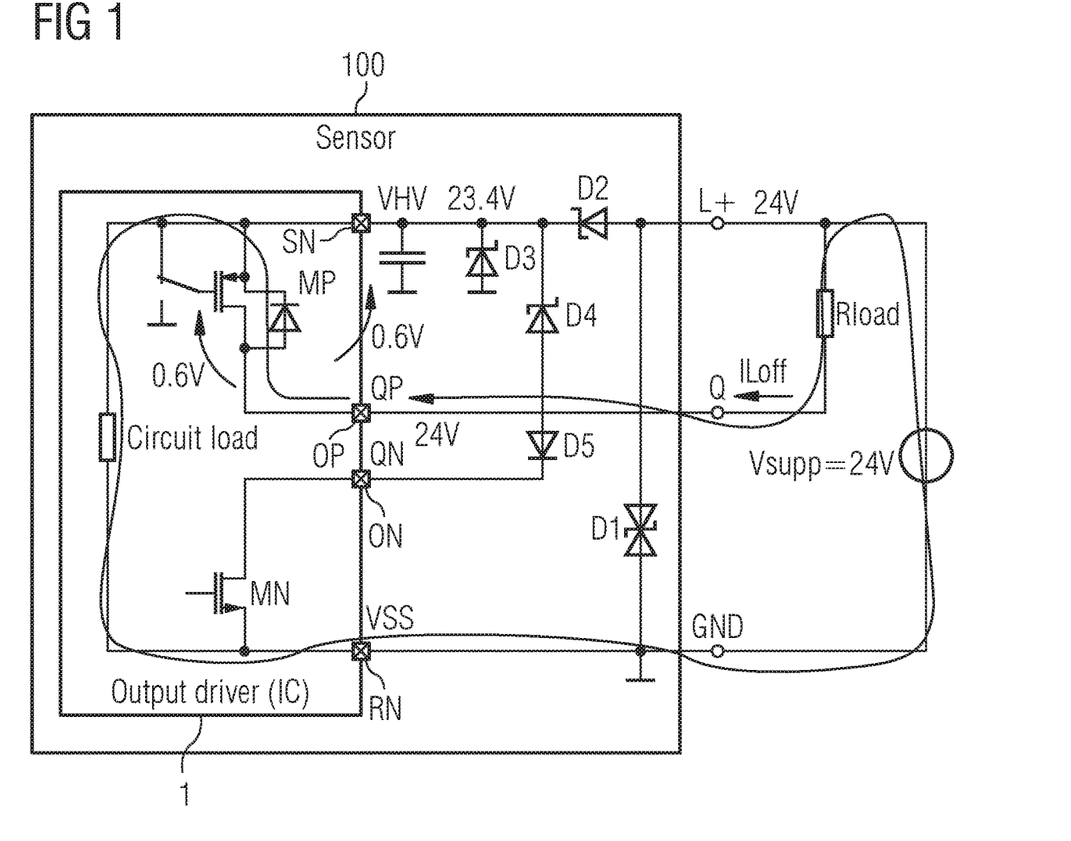
FIG. 1 shows an embodiment of a sensor device comprising an output driver having a driver transistor that starts conducting in reverse in a reverse polarity condition.

An industrial sensor may comprise a 3-wire push-pull output driver. An embodiment of a sensor device 100 comprising an output driver 1 is shown in FIG. 1. The standard for industrial sensors does not allow currents above ILoff=0.5 mA to flow through a load resistor Rload into the sensor's signal wire and through the output terminal Q of the sensor into the output driver 1 via the output node QP of the output driver, regardless of an on/off state of the output driver.

In the presence of a reverse polarity protection diode D2 in the supply path, the output terminal Q of the sensor/the output node QP of the output driver 1 is pulled up above the high supply voltage VHV seen by the output driver at a supply node SN of the driver, if the signal is pulled up by, for example, the load resistance Rload to a potential L+. In the example shown in FIG. 1, the output terminal Q of the sensor 100/the output node QP of the output driver 1 is pulled up to 24 V, i.e. above the high voltage of 23.4 V seen by the output driver 1 at the supply node SN. Under this condition, a driver transistor MP of the output driver conducts in reverse leading to a current flow into the output terminal Q of the sensor device 100/the output node QP of the output driver.

There is a desire to provide an output driver being configured to prevent that a reverse current will flow into the output node of the output driver in a reverse polarity condition independent from an on or off state of the output driver.

SUMMARY

An output driver with reverse current blocking capabilities that prevents any current flow into the sensor's signal wire independent from an on or off state of the output driver is specified in claim 1.

According to an embodiment of the output driver, the output driver comprises a supply node to apply a supply voltage, an output node to provide an output signal, a driver transistor and a gate control circuit. The driver transistor has a gate node to apply a gate control voltage. The driver transistor is configured to provide a current path with a variable resistance between the supply node and the output node. The gate control circuit is configured to control the gate node of the driver transistor.

The output driver is configured to be operable in a first operation mode, for example an on-state, and a second operation mode, for example an off-state. The variable resistance of the current path of the driver transistor is lower in the first operation mode than in the second operation mode. The gate control circuit comprises a controllable resistor. The controllable resistor is disposed between the gate node of the driver transistor and the output node of the output driver. A resistance of the controllable resistor is dependent on operating the output driver in the first or second operation mode.

The output driver allows a reverse current to be prevented from flowing through the driver transistor in the output driver when the driver transistor is enabled, i.e. operated in an on-state, and disabled, i.e. operated in an off-state. The enabled state/on-state of the output driver corresponds to the first operation mode of the output driver, and specifies a state of the output driver in which the resistance of the current path of the driver transistor has a low resistance. In the enabled state/on-state of the output driver, the controllable resistor is operated in a low resistive state. The disabled state/off-state of the output driver corresponds to the second operation mode of the output driver, and specifies a state of the output driver in which the resistance of the current path of the driver transistor has a high resistance. In the disabled/off-state of the output driver, the controllable resistor is operated in a high resistive state.

According to an embodiment of the output driver, the output driver comprises a bulk control circuit to apply a bulk control voltage to a bulk node of the driver transistor. The output driver may be operable in a first condition in which the potential at the output node is lower than the supply voltage, and in a second condition in which the potential at the output node is higher than the supply voltage. The bulk control circuit is configured to apply a level of the bulk control voltage to the bulk node of the driver transistor in dependence on operating the output driver in the first and second condition. Furthermore, the gate control circuit is configured to apply the level of a gate control voltage to the gate node of the driver transistor in dependence on operating the output driver in the first and second condition.

The proposed embodiment of the output driver solves the problem of an undesired reverse current flow into the output driver on IC level by shifting up the reverse voltage at which the driver transistor of the output driver starts conducting in reverse. The bulk control circuit of the proposed circuit configuration is embodied as an independent well/bulk switch. The gate control circuit provides a smart gate control for the isolation and control of the control/gate node of the driver transistor.

Moreover, the output driver enables on IC level a reverse current to be prevented from flowing inside the output driver through a load resistance regardless of the operation mode, i.e. the on-/off-state, of the driver transistor/output driver. In the case of operating the output driver in the first operation mode (on-state), this is achieved by first disabling the driver transistor, as soon as the potential at the output node approaches the supply voltage, and secondly by providing appropriate gate and bulk connection of the driver transistor in order to prevent the reverse current from flowing. The disabling solution differs from classical, comparator-based approaches, as those would result in an oscillating on-off switching operation of the driver.

The implementation of the reverse current blocking principle is done so as to minimize the number of high-voltage transistors in order to be area-efficient. A small chip area can be achieved in particular because no floating supply potential, no series transistors, no charge pump circuit and no floating wells are needed.

The output driver may be embodied as a high-voltage or low-voltage output driver. According to a possible embodiment the output driver may be configured as a 3-wire push-pull high-voltage/low-voltage output driver. The output driver may be used in communication with industrial sensors as a communication interface.

The accompanying drawings are included to provide further understanding and are incorporated in and constitute a part of this specification. The drawings illustrate several embodiments of output drivers, and together with the description, serve to explain principles and the operation of the various embodiments.

DETAILED DESCRIPTION

Figure 2:
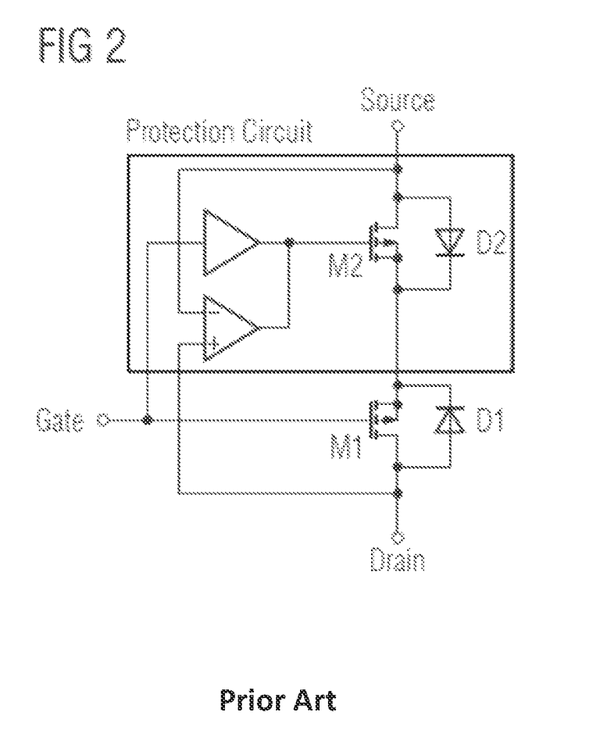
FIG. 2 shows a possible implementation of an output driver for a sensor device having reverse current protection according to a prior art solution.

FIG. 2 illustrates a circuit configuration of a known solution of an output driver for a sensor device having reverse current protection with back-to-back connected PMOS transistors to isolate parasitic diodes in either way as described by Hao-Ping Hong and Jiin-Chuan Wu, Member IEEE, in IEEE JOURNAL OF SOLID-STATE CIRCUITS, VOL. 36, NO. 1, JANUARY 2001: A Reverse-Voltage Protection Circuit for MOSFET Power Switches. The reference signs in FIG. 2 correspond to the reference signs in FIG. 1(a) of the original document of Hao-Ping Hong and Jiin-Chuan Wu.

Two transistors are connected in series with their sources connected together (back-to-back). The additional series transistor increases the area significantly if the driver strength has to remain the same. This solution is not area efficient, as the required area for a driver becomes bigger due to the series connection of two transistors (4× area). Furthermore, in order to control the bulk and the gate potential additional circuitry like comparators or latches are needed.

The proposed solution of FIG. 2 allows supporting reverse voltages up to the voltage level of the normal operation, e.g. 24V, which is not necessarily needed to solve the current problem. This solution also allows the supply voltage to go below the substrate by keeping the reverse current blocked. This feature is also not needed for solving the current problem.

The only cost efficient way to provide a solution for the above-discussed problem of a reverse current flow is a well-switching of the PMOS transistor in addition to a smart gate control to switch off the driver transistor properly in a reverse condition. Such a solution is explained by Hao-Ping Hong and Jiin-Chuan Wu in "A Reverse-Voltage Protection Circuit for MOSFET Power Switches".

Figure 3:
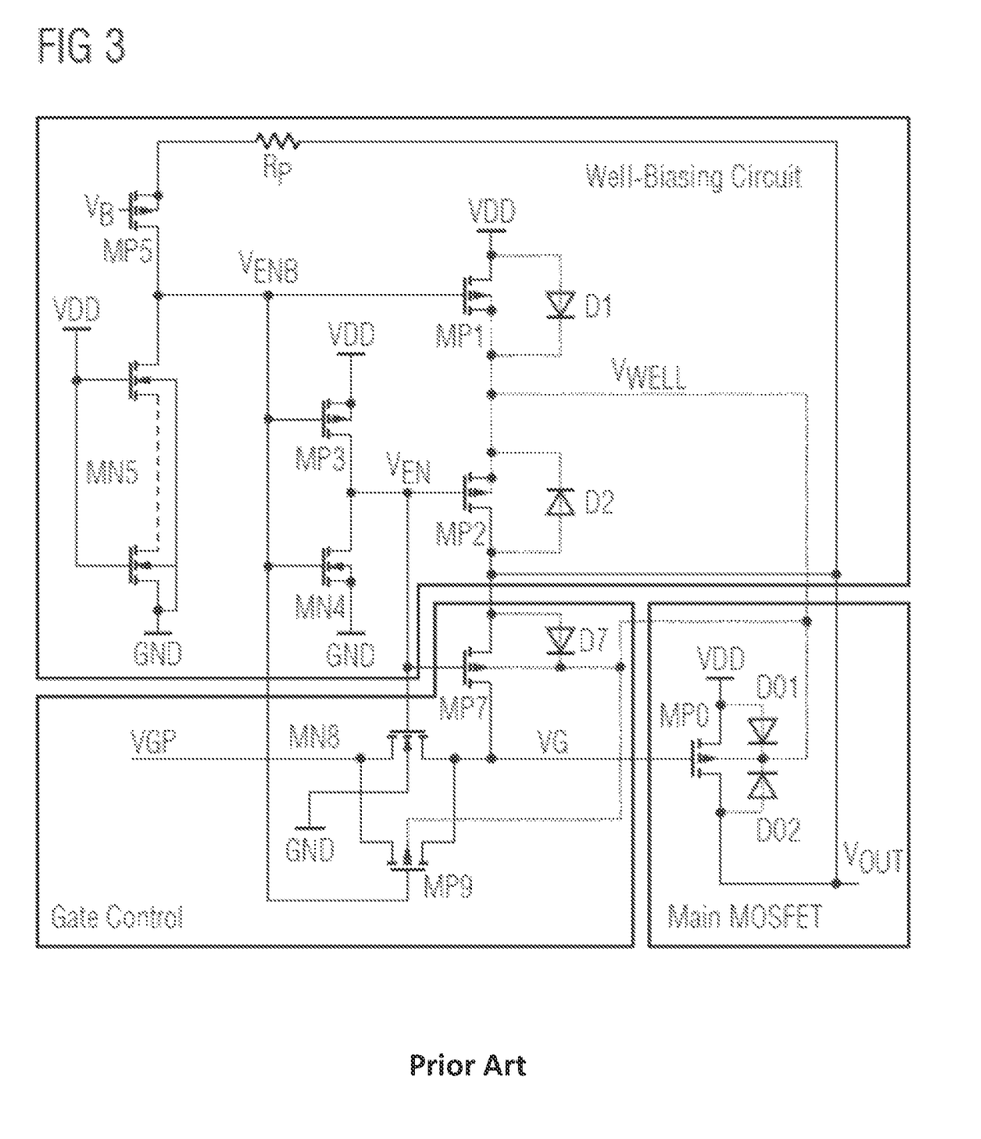
FIG. 3 shows a possible implementation of an output driver for a sensor device having reverse current protection with a smart gate control of a driver transistor according to another prior art solution.

FIG. 3 shows a possible implementation of a reverse protection circuit according to Hao-Ping Hong and Jiin-Chuan Wu with smart gate control. The reference signs in FIG. 3 correspond to the reference signs in FIG. 2 of the original document of Hao-Ping Hong and Jiin-Chuan Wu. It has a well-switch with a gate control to switch off and isolate the gate driver which are both controlled by a reverse condition comparator.

However, the circuit does only work at voltage levels below 5V. In order to operate this circuit at a supply voltage VDD>5V, the state GND should represent a low-voltage floating ground referred to the upper rail VDD. A bulk switch itself prevents from destruction (e.g. due to latch-up, etc.) but does not solve the reverse current blocking, since it does not control the gate of the driver transistor.

Figure 4:
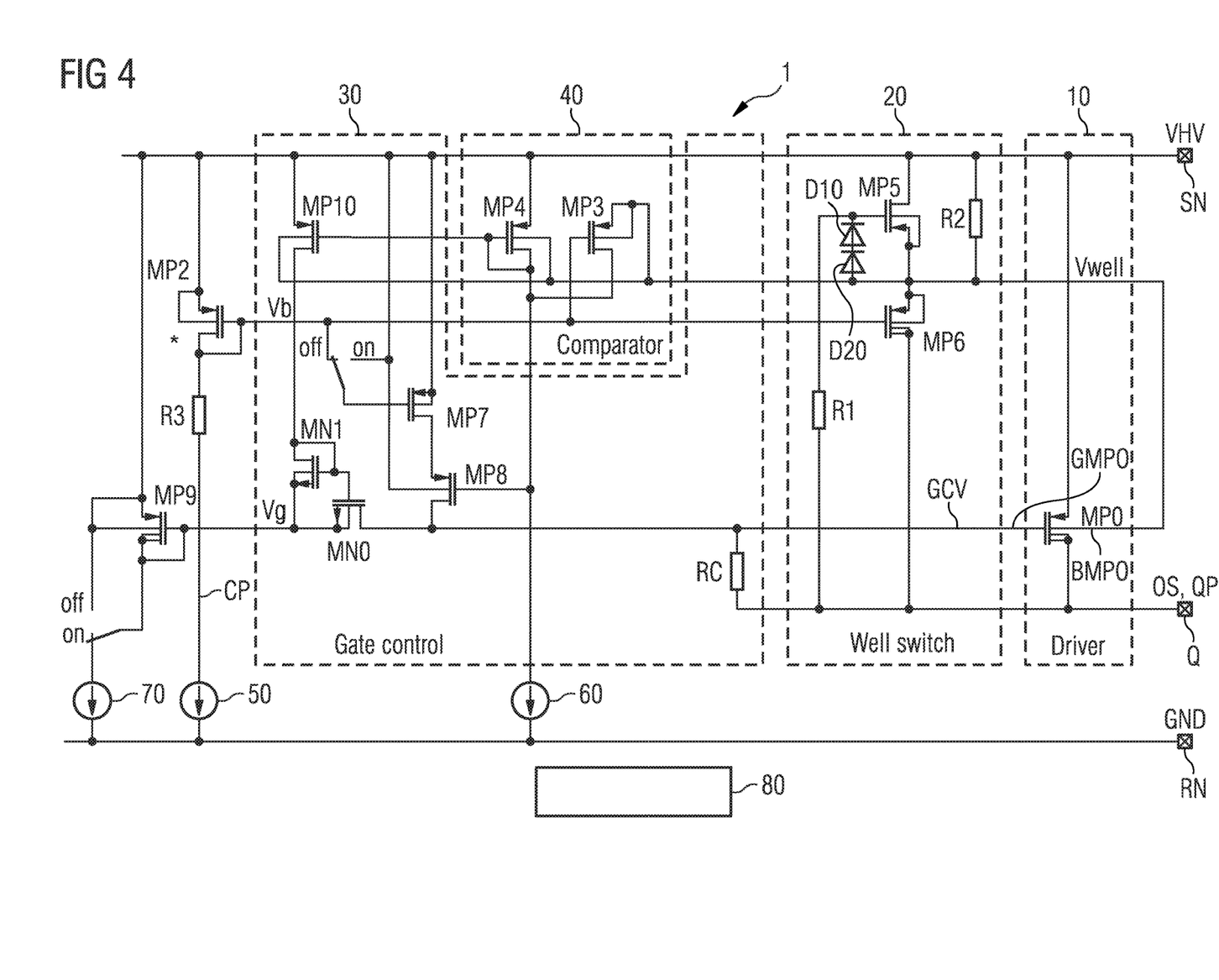
FIG. 4 shows an embodiment of an output driver having reverse current protection when operated in a reverse polarity condition independent on an on-/off-operation mode of the output driver.

FIG. 4 shows an embodiment of an output driver 1 with protection against reverse current flowing into the output driver. The output driver 1 comprises a supply node SN to apply a supply voltage VHV and an output node Q to provide an output signal OS. The output driver 1 further comprises a driver transistor MP0 having a gate node GMP0 to apply a gate control voltage GCV. The driver transistor MP0 is configured to provide a current path with a variable resistance between the supply node SN and the output node QP. The output driver comprises a gate control circuit 30 to control the gate node GMP0 the driver transistor MP0.

The output driver is configured to be operable in a first operation mode, for example an on-state, and a second operation mode, for example an off-state. The variable resistance of the current path of the driver transistor MP0 is lower in the first operation mode (on-state) than in the second operation mode (off-state). The gate control circuit 30 comprises a controllable resistor RC. The controllable resistor RC is disposed between the gate node GMP0 of the driver transistor MP0 and the output node QP of the output driver 1. A resistance of the controllable resistor RC is dependent on operating the output driver 1 in the first operation mode (on-state) or the second operation mode (off-state).

The output driver 1 further comprises a bulk/well control circuit 20 to apply a bulk control voltage Vwell to a bulk node BMP0 of the driver transistor MP0. The gate control circuit 30 is configured to apply a gate control voltage GCV to the gate node GMP0 of the driver transistor MP0.

In a reverse polarity condition, the output driver 1 enables to prevent a reverse current from flowing through the output node QP and the driver transistor MP0 into the output driver regardless of whether the output driver is enabled, i.e. operated in the first operation mode (on-state), or disabled, i.e. operated in the second operation mode (off-state). That means that the output driver provides protection against reverse current flowing into the output driver in the on-state and the off-state of the output driver.

In particular, the output driver 1 is configured to prevent any reverse current flowing via the output node QP and through the driver transistor MP0 into the output driver independent from a conductive state of the current path of the driver transistor MP0 in the first operation mode of the output driver or a non-conductive state of the current path of the driver transistor MP0 in the second operation mode (off-state).

The output driver 1 may be operated in a first condition in which the potential OS at the output node QP is lower than the supply voltage VHV, and in a second condition in which the potential OS at the output node QP of the output driver is higher than the supply voltage VHV. The bulk control circuit 20 is configured to apply a level of a bulk control voltage Vwell to a bulk node BMP0 of the driver transistor MP0 in dependence on operating the output driver in the first and second condition. The gate control circuit 30 is configured to apply a level of the gate control voltage GCV to the gate node GMP0 of the high side driver transistor MP0 in dependence on operating the output driver in the first and second condition.

The output driver advantageously has an independent bulk control circuit being configured as a well-switch and a gate control circuit. The gate control circuit is configured as a smart gate control and allows the isolation and control of the gate node of the driver transistor. This covers the aspect of providing an appropriate gate and bulk connection of the driver transistor MP0 in the reverse operation so as to prevent any reverse current above a specified limit.

The bulk control circuit 20 is configured to apply the supply voltage VHV to the bulk node BMP0 of the driver transistor MP0, when the output driver 1 is operated in the first condition. The bulk control circuit 20 is further configured to apply the potential OS at the output node QP to the bulk node BMP0 of the driver transistor MP0, when the output driver 1 is operated in the second condition.

The gate control circuit 30 is configured to apply the supply voltage VHV to the gate node GMP0 of the driver transistor MP0, when the output driver 1 is operated in the first condition of the second operation mode. The gate control circuit 30 is further configured to apply the voltage Vg to the gate node GMP0 of the driver transistor MP0, when the output driver 1 is operated in the first condition of the first operation mode. The gate control circuit 30 is configured to apply the potential OS at the output node QP of the output driver to the gate node GMP0 of the driver transistor MP0, when the output driver 1 is operated in the second condition.

That means that the bulk node BMP0 and the gate node GMP0 can advantageously be controlled by voltage potentials that are provided at the supply node and the output node so that additional circuits to generate the control signals/voltages are not needed. As a result, the output driver can be realized with a small chip area.

The bulk control circuit 20 comprises a transistor MP5 being disposed between the supply node SN and the bulk node BMP0 of the driver transistor MP0. A bulk node of the transistor MP5 is connected to the source node of the transistor MP5. A control node of the transistor MP5 is coupled to the output node QP via a first resistor R1. The control node of the transistor MP5 is further connected to the bulk node BMP0 via the in-series connected diodes D10 and D20.

Diodes D10 and D20 are advantageously provided to enable a VGS protection of the transistor MP5. The diodes D10 and D20 can be implemented, for example as LV (Low-Voltage) PMOS-transistors with their bulk nodes connected to the bulk node BMP0/bulk control voltage Vwell.

The bulk control circuit 20 further comprises a transistor MP6 being disposed between the bulk node BMP0 of the driver transistor MP0 and the output node QP of the output driver 1. The bulk node of the transistor MP6 is connected to the source node of the transistor MP5 or the bulk node BMP0 of the driver transistor MP0. The bulk control circuit 20 comprises a resistor R2 being disposed between the supply node SN and the bulk node BMP0 of the driver transistor MP0.

The resistor R2 advantageously enables to pull up the bulk node BMP0, when the potential at the output node QP of the output driver is closer than a threshold voltage from the supply potential VHV. Moreover, during normal operation, only a negligible current flows in the direction towards the output node QP of the output driver.

As further shown in FIG. 4, the output driver comprises a reference node RN to apply a reference voltage GND, and a current path CP being arranged between the supply node SN and the reference node RN. The current path CP comprises a current source 50, a resistor R3 and a diode MP2. The current source 50 is connected to the reference node RN. The resistor R3 is connected to the first current source 50. The diode MP2 is disposed between the supply node SN and the resistor R3. The diode MP2 is realized by a transistor having gate and drain nodes which are connected to each other. The gate node of the transistor MP2 is connected to the gate node of the transistor MP6. The bulk node of the transistor MP2 is connected to the source node of the transistor MP2 and to the supply node SN.

The high-voltage output driver 1 comprises a current source 60 being connected to the reference node RN. The high-voltage output driver 1 further comprises a detection circuit 40 to detect the first and the second condition of output driver 1. The detection circuit 40 comprises a transistor MP3 and a transistor MP4. The transistor MP3 is disposed between the bulk node BMP0 of the driver transistor MP0 and a current source 60. The bulk node of the transistor MP3 is connected to the source node of the transistor MP4. The transistor MP4 is disposed between the supply node SN and the current source 60. The drain node of the transistor MP3 is connected to the drain node of the transistor MP4. The bulk node of the transistor MP4 is connected to the drain node of the transistor MP4. The gate node of the transistor MP3 is connected to the gate node of the transistor MP4. The drain node of the transistor MP4 is connected to its gate node.

The current source 60 advantageously provides a constant current for the gate control circuit 30 and the detection circuit 40. According to the configuration of the detection circuit, the detection circuit 40 is embodied as a comparator which advantageously allows to detect the first and second condition by monitoring the bulk control voltage.

The gate control circuit 30 comprises a transistor MP7 and a transistor MP8. The source node of the transistor MP7 is connected to the supply node SN. The bulk node of the transistor MP7 is connected to supply node SN. The source node of the transistor MP8 is connected to the drain node of the transistor MP7, and the drain node of the transistor MP8 is connected to the gate node GMP0 of the driver transistor MP0. The bulk node of the transistor MP8 is connected to the supply node SN.

The gate node of the transistor MP7 is connectable to one of the gate node of the transistor MP2 and the supply node SN via a controllable switch. The gate node of the transistor MP8 is connected to the respective drain node of the transistor MP3 and the transistor MP4 and the current source 60.

The transistors MP7 and MP8 advantageously enable to connect the gate node of the driver transistor MP0 to the supply potential VHV during normal operation. For this purpose, the transistors MP7 and MP8 have simply to be switched off.

The high-voltage output driver 1 further comprises a current source 70 being connected to the reference node RN. The output driver 1 further comprises a transistor MP9 being connected between the supply node SN and the current source 70. The bulk node of the transistor MP9 is connected to the source node of the transistor MP9. Furthermore, the bulk node of the transistor MP9 is connectable to the current source 70 or the drain node of the transistor MP9 via a controllable switch.

The gate control circuit 30 comprises a transistor MN0 being disposed between the gate node of the transistor MP9 and the gate node GMP0 of the driver transistor MP0. The bulk node of the transistor MN0 is connected to the gate node of the transistor MP9. The gate control circuit 30 is configured to apply the gate voltage at the gate node of the transistor MP9 to the gate node GMP0 of the driver transistor MP9, when the output driver 1 is operated in the first condition of the first operation mode.

The gate control circuit 30 further comprises a transistor MP10 and a transistor MN1. The transistors MP10 and MN1 are disposed in series between the supply node SN and the gate node of the transistor MP9. The source node of the transistor MP10 is connected to the supply node SN, the drain node of the transistor MP10 is connected to the drain node of the transistor MN1, and the gate node of the transistor MP10 is connected to the gate node of the transistor MP4. The bulk node of the transistor MP10 is connected to the bulk node BMP0 of the driver transistor MP0. The drain node of the transistor MN1 is connected to the gate node of the transistor MN0, and the gate node of the transistor MN1 is connected to the gate node of the transistor MN0. The bulk node of the transistor MN1 is connected to the gate node of the transistor MP9.

This circuit configuration advantageously enables to operate the transistors MP10 and MP4 as a current mirror. In the reverse condition, the current mirror is switched off. The switching-off operation of the current mirror allows to reduce the gate source voltage of the transistor MN1 and thus switching off transistor MN0.

Figure 5A:
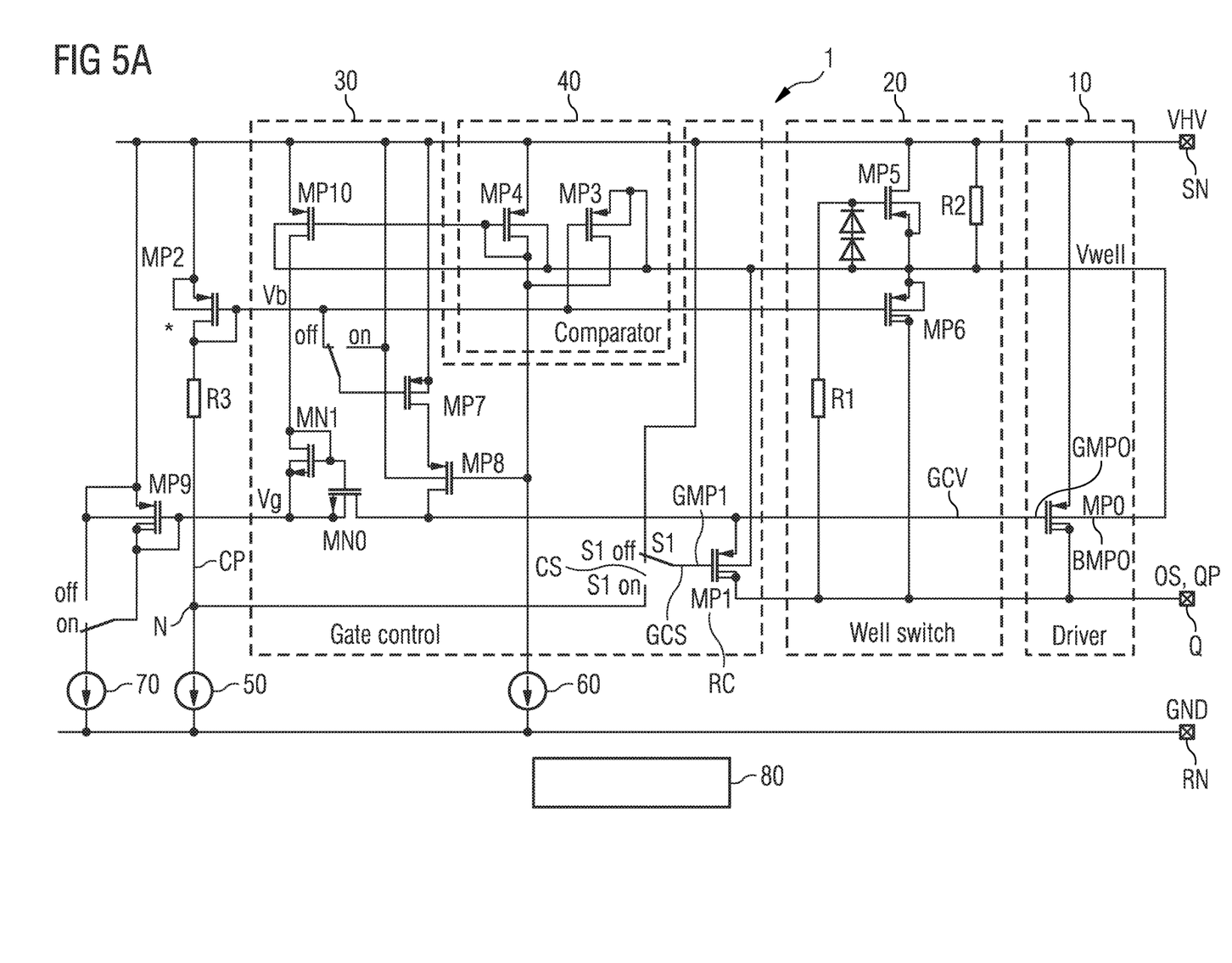
FIG. 5A shows another embodiment of an output driver having reverse current protection when operated in a reverse polarity condition independent on an on-/off-operation mode of the output driver.

FIG. 5A shows another embodiment of the output driver 1, wherein the controllable resistive element RC comprises a transistor MP1 or is embodied as a transistor MP1. The transistor MP1 is disposed between the gate node GMP0 of the driver transistor MP0 and the output node QP of the output driver.

The proposed configuration enables the disabling of the driver transistor MP0 by means of the transistor MP1. The control of the driver transistor is advantageously performed by an element which may be configured as a matched transistor and which pulls up the gate of the driver transistor MP0 based on the same mechanism that would turn on the driver transistor MP0 in reverse. This ensures that there is no range above the supply voltage VHV where the driver transistor MP0 could turn on in reverse, causing current to flow into the output node QP.

According to a possible embodiment of the output driver 1, the transistor MP1 has a gate node GMP1 to apply a gate control signal GCS to control the transistor MP1. The gate control signal GCS is dependent on operating the output driver in the first operation mode (on-state) or the second operation mode (off-state).

The configuration of the output driver using the transistor MP1 to control the gate control voltage GCV at the gate node GMP0 of the driver transistor MP0 enables the problem of the reverse current to be solved by emulating a reverse protection Schottky diode at the output node QP of the output driver regardless of the operation mode, i.e the on- or off-state, of the output driver. Compared to an external Schottky diode, the advantage of the emulated diode is that it does not cause any additional voltage drop which does not interact with the driver size.

This covers the aspect of disabling the output driver 1/the driver transistor MP0 when the potential at the output node QP of the output driver approaches the supply potential VHV. In this regard, reference is made to the V-I-characteristic of the output driver, particularly, the normal operation region shown in FIG. 6.

The control of the gate node GMP0 of the driver transistor MP0 by the transistor MP1 enables that the driver transistor MP0 is disabled entirely, i.e. switched in a non-conductive or high resistive state, before the voltage difference between the supply node SN and the output node QP becomes zero. Otherwise, the supply node SN would be pulled-up by the driver transistor MP0 itself and the reverse condition could not be detected anymore.

The disabling of the driver transistor MP0 occurs in a smooth way, as if there was a series connected reverse protection Schottky diode arranged between the output node QP and the gate node GMP0 of the driver transistor. Compared to classical comparator-based approaches, the progressive disabling of the driver transistor MP0 makes sure that there is no oscillation due to hard on-off switching after the detection of the potential QP being close to the supply potential VHV.

The voltage difference OS-VHV at which the driver transistor MP0 is disabled occurs within a reasonable voltage range so as to cope with other main requirements of the output driver, for example an on-resistance at a given output current, short-circuit detection circuit, etc.

According to the embodiment of the output driver shown in FIG. 5A, the gate control signal GCS is applied to the gate node GMP1 of the transistor MP1 with different voltage levels. In the first operation mode (on-state), the gate control signal GCS is applied to the gate node GMP1 of the transistor MP1 with a voltage level below the voltage level of the supply voltage VHV. In the second operation mode (off-state), the gate control signal GCS is applied to the gate node GMP1 of the transistor MP1 with a voltage level of the supply voltage VHV.

The configuration of the output driver using voltage levels for the gate control signal which are derived from the supply voltage allows to generate the gate control signals by easy tapping the gate control signal at available circuit structures. As a consequence, no additional external components are needed so that the output driver can be realized with an area-efficient design.

According to the embodiment of the output driver 1 shown in FIG. 5A, the gate control circuit 30 comprises a controllable switch CS to apply the voltage level of the gate control signal GCS to the gate node GMP1 of the transistor MP1. The controllable switch CS is connected to the gate node GMP1 of the transistor MP1.

Figure 5B:
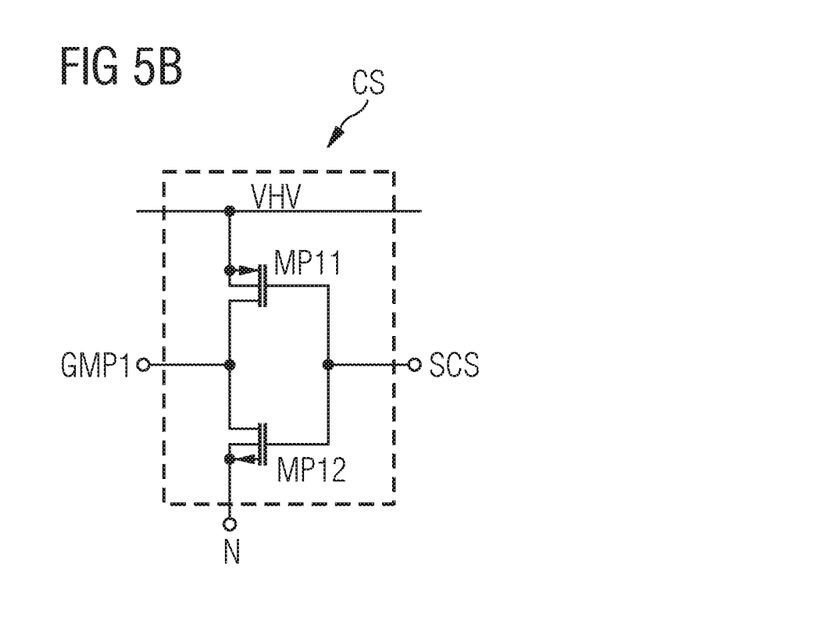
FIG. 5B shows an embodiment of a controllable switch of an output driver having reverse current protection.

The proposed configuration of the output driver using a controllable switch to apply the gate control signal to the gate node of the transistor MP1 allows to realize the application of the gate control signal to the transistor MP1 by an area-efficient electrical component. FIG. 5B shows a possible embodiment of the controllable switch CS which can be realized by in series connected transistors MP11 and MP12. The transistor MP11 is arranged between the supply node to apply the supply potential VHV and the gate node GMP1. The transistor MP12 is arranged between an internal node N providing a potential below the supply potential VHV and the gate node GMP1. The gate nodes of the transistors MP11 and MP12 are controlled by a control signal SCS which has to be provided, for example by a controller or a level shifter, depending on the desired switching state of the controllable switch CS.

Regarding the embodiment of the controllable switch CS shown in FIG. 5B, the respective gate node of the transistors MP11 and MP12 may be connected to the supply node SN to apply the control signal SCS with a high voltage level, for example the supply voltage VHV. In this switching state, the controllable switch provides the potential of the node N to the gate node GMP1 of the transistor MP1. On the other hand, the gate node of the transistors MP11 and MP12 may be coupled to a control voltage below the supply voltage VHV, in order to provide the supply potential VHV at the gate node GMP1 of the transistor MP1.

As illustrated in FIG. 5A, the controllable switch CS has at least a first switching state S1on and a second switching state S1off. The controllable switch CS is configured such that, in the first switching state S1on, the voltage level below the voltage level of the supply voltage VHV is applied to the gate node GMP1 of the transistor MP1. In the second switching state S1off of the controllable switch CS, the voltage level of the supply voltage VHV is applied to the gate node GMP1 of the transistor MP1.

According to a possible embodiment of the output driver 1, the controllable switch CS is configured such that, in the first switching state S1on, the gate node GMP1 of the transistor MP1 is connected to a node N at a voltage level below the voltage level of the supply node SN. The node N may be an internal node of the current path CP between the current source 50 and the resistor R3. The controllable switch CS is configured such that, in the second switching state S1off, the gate node GMP1 of the transistor MP1 is connected to the supply node SN.

The proposed circuit configuration allows to provide the voltage levels for the gate control signal GCS from internal nodes of an available circuit structure by switching the controllable switch CS between only two switching states. In the easiest way, the voltage level below the supply potential VHV may be generated by a voltage divider. In this case, the controllable switch CS connects the gate node GMP1 of the transistor MP1 in the first switching state S1on to an internal node of the voltage divider.

According to a possible embodiment of the output driver 1, the output driver may comprise a controller 80 to control the first and the second switching state S1on, S1off of the controllable switch CS in dependence on operating the output driver 1 in the first operation mode or the second operation mode.

The complete functionality of the output driver 1 may be advantageously controlled by only one controller component. The controller 80 may generate the control signals to control the switching states of the controllable switches of the output driver by digital signals so that no complex circuit structure is necessary.

The controller 80 may be configured to control the controllable switch CS to be switched in the first switching state S1on, when the output driver 1 is operated in the first operation mode (on-state). The controller 80 is further configured to control the controllable switch CS to be switched in the second switching state S1off, when the output driver 1 is operated in the second operation mode (off-state). That means that the controller 80 is advantageously embodied to only generate two control signals to control the controllable switch CS.

The operation of the embodiment of the high-voltage output driver is described in the following.

The main high-side driving transistor of the output driver 1 is the transistor MP0 of the output driver stage 10. In the second condition of the output driver 1, i.e. in a reverse polarity condition in which the potential OS at the output node QP is higher than the supply potential VHV at the supply node SN (OS>VHV), both the bulk node BMP0 and the gate node GMP0 of the driver transistor MP0 have to be connected to the output node QP to apply the potential OS to the bulk node BMP0 and to the gate node GMP0 of the driver transistor MP0 in order to prevent any current to flow into the output node/pin QP. Otherwise the mentioned current would flow either through the body diode of the transistor MP0 or the transistor MP0 would start conducting in reverse.

The connection of the bulk node BMP0 of the driver transistor MP0 is provided by the bulk control circuit/well-switch 20 comprising the transistors MP5, MP6 and the resistor R1. During the first condition of the output driver 1, i.e. during the normal operation in which the potential OS at the output node QP is lower than the supply potential VHV at the supply node SN (OS<VHV), the potential Vwell applied to the bulk node BMP0 is pulled up to the supply potential VHV by means of the transistor MP5 whose gate voltage is controlled by the potential at the output node QP through the resistor R1.

When the potential OS at the output node QP is close to the supply potential VHV at the supply node SN, in particular, when the potential OS is closer than a threshold voltage from the supply potential VHV, the voltage potential Vwell at the bulk node BMP0 of the driver transistor MP0 is pulled up by a resistor R2. The gate of the transistor MP6 is biased by a bias voltage Vb such to provide a negligible leakage current to the output node QP during first (normal) condition (OS<VHV).

As soon as the potential OS at the output node QP becomes higher than the supply potential VHV at the supply node SN (second condition: OS>VHV), the gate of the transistor MP5 is pulled up to the potential OS disabling the transistor MP5. At the same time, the transistor MP6 whose gate voltage is biased at one threshold voltage below the supply potential VHV starts conducting pulling up the potential Vwell at the bulk node BMP0 to the potential OS that is applied to the output node QP. This procedure isolates the drain-to-bulk diode of the driver transistor MP0 and prevents any current to flow through it, except of the current provided by the resistance of the resistor R2.

The pulling up of the potential GCV at the gate node GMP0 of transistor MP0 is provided by the transistor MP1 which is of the same type as the main driver transistor MP0.

In the second operation mode (off-state) of the output driver, the main driver transistor MP0 would start conducting sinking current to the supply node SN as soon as the potential OS at the output node QP became higher than its threshold voltage in reverse operation. The transistor MP1 starts conducting under the same circumstances as the transistor MP0 would do, thus at the same voltage OS at output node QP. This is valid since the gate voltage GCV of the transistor MP0 in the second operation mode (off-state) is pulled up to the supply potential VHV providing the same gate-to-drain voltage as seen by the transistor MP1.

In the previous mentioned operation mode (off-state), the transistor MP1 starts conducting pulling up the voltage potential GCV at the gate node GMP0 of transistor MP0 to the potential OS of the output node QP. This ensures that the transistor MP0 is never conducting in reverse. Moreover, this ensures that there is no voltage range or gap above the supply voltage VHV where transistor MP0 is conducting in reverse.

Figure 6:
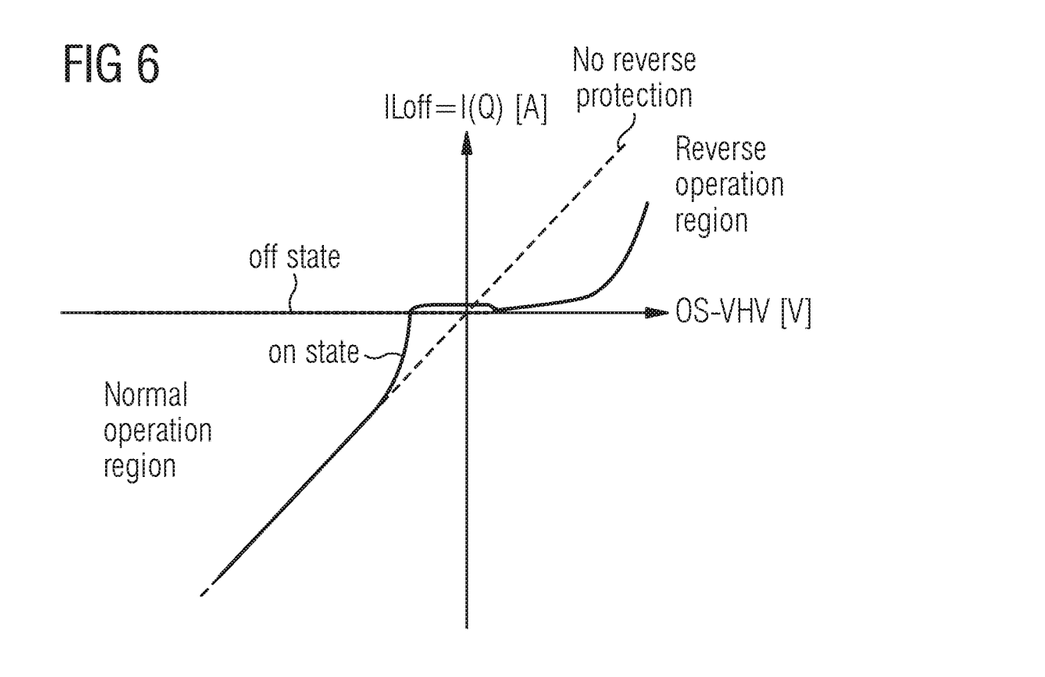
FIG. 6 shows a V-I-characteristic of an output driver having reverse current protection in an on-/off-operation mode of the output driver.

In the first operation mode (on-state) of the output driver, in order to prevent excessive reverse current from flowing, the transistor MP0 has to be turned off in the normal operating region (FIG. 6). This has to be ensured, otherwise the transistor would pull up the node RN to the potential of the output node QP, deactivating the supply current flowing through the diode D2, and leading the whole supply current through MP0, which is not allowed by the standards for industrial sensors.

To prevent this, in the first operation mode (on-state) of the output driver, the gate of the transistor MP1 is connected to a potential below VHV. This ensures that the transistor MP1 starts conducting when the output node QP approaches the supply potential VHV (e.g. 100 mV) at the supply node RN. Once transistor MP1 starts conducting the gate of the main driver MP0 is pulled up to the potential at the node QP, deactivating the main driver MP0. Since the gate control circuitry 30 is still counteracting against the transistor MP1 the current provided by the current source 70 on transistor MP9 will result as the main reverse current in this condition, which is acceptable as long as the current remains below the level specified by the standards for industrial sensors. Deactivating the main driver MP0 will allow the potential of node QP to raise above VHV, respectively to settle to the reverse condition, as described for the second operation mode (off-state) of the main driver.

In the second operation mode (off-state), to allow the transistor MP1 pulling up the gate voltage GCV of transistor MP0 to the potential OS at output node QP in the reverse condition, the transistors MP7 and MP8, which are connecting the gate node GMP0 of the transistor MP0 to the supply potential VHV during the second operation mode/normal off state, have to be switched off. This is achieved by detecting the reverse operation by means of a comparator/detection circuit 40.

The comparator/detection circuit 40 comprises the transistors MP3 and MP4. During the second operation mode (normal operation/off-mode) the transistor MP4 generates a gate-source voltage which enables the transistor MP8 such to pull up the potential GCV at the gate node GMP0 of transistor MP0 to the supply potential VHV through the transistor MP7. As soon as the voltage potential OS at the output node QP goes above the supply potential VHV the bulk/well potential Vwell is pulled up by the bulk control circuit/well-switch 20 to the potential OS. This enables also the transistor MP3 which will pull up the potential at the gate node of transistor MP8 to the bulk potential Vwell in order to isolate it from transistor MP7.

The particularity of the proposed comparator/detection circuit 40 is that it operates in the current mode. Moreover, it does not sense the potential at the output node QP of the driver directly but it senses the bulk/well potential Vwell of the transistor MP0 which represents the potential OS at the output node QP of the output driver 1, as soon as a reverse condition is achieved.

This allows the use of isolated LV (Low-Voltage)-transistors, as the high voltage during the normal operation is not seen by the comparator 40. Regarding the circuit configuration of FIG. 5A, the transistors having a double drain connection are HV (High-Voltage) transistors, whereas the other transistors are LV (Low-Voltage) transistors.

During the second operation mode, transistor MP0 is operated in the non-conductive/open state. In the second operation mode (off-mode), beside transistor MP8 also transistor MN0 has to be opened, i.e. operated in the non-conductive state, to allow transistor MP1 to pull up the gate voltage GCV of transistor MP0 to the potential OS at the output node QP. This is provided by the same comparator/detection circuit 40 which pulls up the gate voltage GCV of transistor MN0 through transistors MP10 and MN1.

In the reverse condition state, as the transistor MP3 pulls up the gate of transistor MP4 to the bulk/well potential Vwell, also the mirror comprising the transistors MP10 and MP4 will switch off. This leads the gate source voltage of transistor MN1 to become less than its threshold voltage and thus switching off transistor MN0 as well. Like this the transistor MP1 is able to pull up the potential GCV at the gate node GMP0 of transistor MP0 while all the other transistors/switches are turned off.

The isolation of the reverse current required by the standards for industrial sensors has to be released if there are no ESD diodes between the supply node SN and the output node QP. Otherwise the well potential Vwell would be pulled up to a voltage which exceeds the safe operating voltage of the LV-transistors in respect to the supply voltage VHV.

To overcome this operation state, the bulk connections of transistors MP7 and MP8 are tight to the supply potential VHV. This allows a reverse operation of about one diode voltage plus the reverse threshold voltage of the transistor MP0 resulting in ~1.5V. Above one diode voltage of reverse operation the body diodes of MP7 and MP8 clamp the gate node of transistor MP0 which will start conducting again pulling up to the supply potential VHV. This makes sure that the difference between potentials OS and VHV cannot become too high such to damage the LV-transistors.

FIG. 6 illustrates a V-I-characteristic of the output driver 1 for operating the output driver in the first operation mode (on-state) and the second operation mode (off-state). In the normal operation region the potential OS at the output node QP is lower than the supply potential VHV. In the first operation mode (on-state) an output current ILoff is generated at the output node QP. If the output driver is operated in the second operation mode (off-state) no output current is generated. As further shown in FIG. 6, when the potential QP approaches the supply voltage VHV a small current ILoff flowing into the output driver occurs. In the reverse operation region, when the potential OS at the output node QP is larger than the supply voltage VHV an input current ILoff can be significantly avoided.

When compared to the circuit configurations shown in FIGS. 2 and 3, the proposed circuit configuration does not require any additional external diodes, as the problem is solved in the high-voltage output driver 1 by means of a bulk control circuit/well-switch 20 in combination with a smart gate control circuit 30.

Compared to the circuit configuration shown in FIG. 2, the embodiment of the output driver 1 as shown in FIGS. 4 and 5A does not add significant chip area, as there is no need of a transistor connected in series with the main driving transistor.

Compared to the circuit configuration shown in FIG. 3 the embodiment of the output driver 1 of FIGS. 4 and 5A has the following properties.

The generation of the gate control by the gate control circuit 30 and the reverse detection by the comparator/detection circuit 40 takes place in a voltage range within about 3.6V from the upper rail. This allows the use of isolated LV (low-voltage)-transistors operated at the upper rail VHV, except one transistor, i.e. the transistor MP1. This saves area as the HV (high voltage)-transistors occupy a big overhead in area.

The disabling of the main driver transistor MP0 is provided by means of the matched transistor MP1, which pulls up the gate GMP0 of the main driver based on the same mechanism that would turn on the main driver transistor in reverse. This ensures that there is no range above the supply voltage VHV where the main driver transistor MP0 could turn on in reverse causing a current flowing into the output node/pin QP. This makes this circuit particularly suitable for the requirements provided by the standards in combination with a reverse polarity protection diode D2, since the reverse voltage in the critical condition is equal to ~0.6V close to the supply voltage of the output driver.

The circuit configuration of FIGS. 4 and 5A does not necessarily need a floating low-voltage supply referred to the upper rail, since there is no logic needed, e.g. inverters, to control the transistors. This saves significant chip area and power consumption.

The embodiment of the output driver 1 provides the flexibility to choose up to which reverse voltage the isolation of the input current ILoff has to be ensured. This is needed to self-protect the gates of the control transistors in case of an ESD event, especially during the IC manufacturing, when the external protection circuitry is not available. The circuit passively releases the isolating property of the input current.

Furthermore, according to the embodiment of the output driver 1, the loop gain from the drain of the driver transistor to its gate connection is kept low to avoid any instabilities.

In the following, some possible applications in which the output driver may be used, are described.

Figure 7:
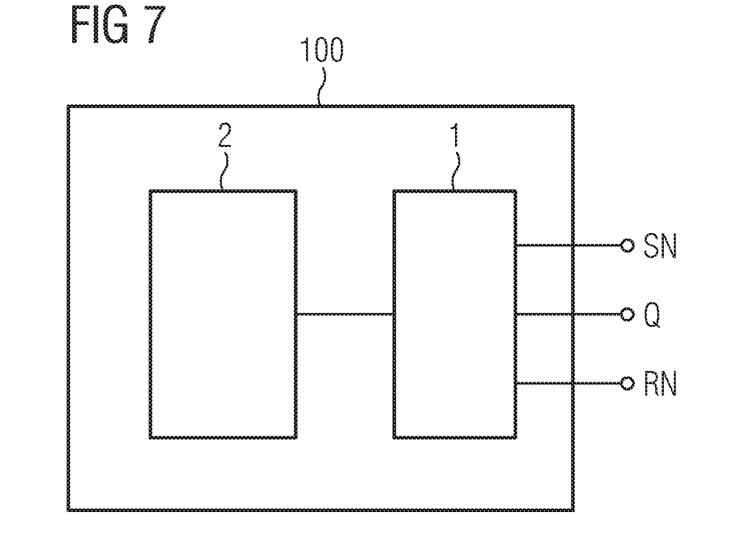
FIG. 7 shows an embodiment of a sensor system including an output driver with reverse current protection.

The output driver 1 may be used, for example, in a sensor system, as shown in FIG. 7. The sensor system 100 of FIG. 7 comprises the output driver 1 and a sensor device 2. The output driver 1 is coupled to the sensor device 2 to amplify an input signal of the sensor device. The output driver may be configured as a high-voltage or low-voltage output driver. In particular, the output driver 1 can be embodied as a three-wire push-pull high-voltage/low voltage output driver. Basically, the embodiment of the output driver shown in FIGS. 4 and 5A is suitable for three-wire output interfaces with external supply reverse polarity protection diode.

Figure 8:
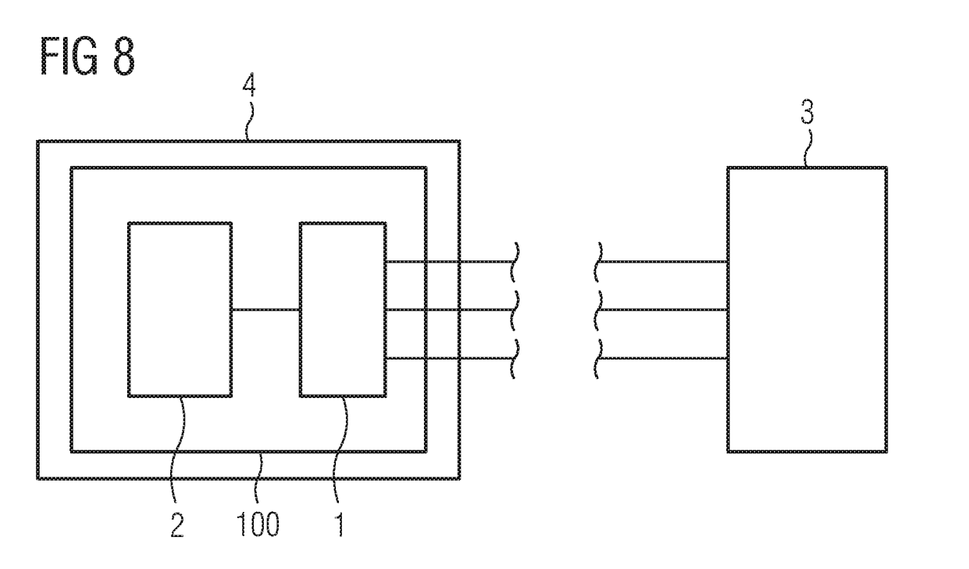
FIG. 8 shows an embodiment of a digital communication system comprising an output driver with reverse current protection.

The output driver 1 may be further used in a digital communication system, as shown in FIG. 8. The digital communication system may comprise an IO-link master 3 and an IO-link device 4. The IO-link device is coupled to the IO-link master. In particular, the IO-link device 4 may comprise the sensor system 100 including the output driver 1 and the sensor device 2. According to the digital communication system shown in FIG. 8, the output driver 1 may be configured as a digital communication interface of the IO-link device 4. The sensor device may be any industrial sensor, for example a photoelectric sensor, a proximity sensor, a retro-reflective sensor or a through-beam sensor.

The invention claimed is:

1. An output driver, comprising:
    a supply node to apply a supply voltage,
    an output node to provide an output signal of the output driver,
    a driver transistor having a gate node to apply a gate control voltage, the driver transistor being configured to provide a current path with a variable resistance between the supply node and the output node,
    a gate control circuit to control the gate node of the driver transistor,
    wherein the output driver is configured to be operable in a first operation mode and a second operation mode, the variable resistance of the current path of the driver transistor being lower in the first operation mode than in the second operation mode,
    wherein the gate control circuit comprises a controllable resistor, the controllable resistor comprising a first transistor that is disposed between the gate node of the driver transistor and the output node of the output driver, the first transistor having a gate node to apply a gate control signal to control the first transistor, the gate control signal being dependent on operating the output driver in the first or second operation mode, and a resistance of the controllable resistor being dependent on operating the output driver in the first or second operation mode.

2. The output driver of claim 1,
    wherein, in the first operation mode, the gate control signal is applied to the gate node of the first transistor with a voltage level below the voltage level of the supply voltage,
    wherein, in the second operation mode, the gate control signal is applied to the gate node of the first transistor with a voltage level of the supply voltage.

3. The output driver of claim 1, wherein the gate control circuit comprises a controllable switch to apply the voltage level of the gate control signal to the gate node of the first transistor, the controllable switch being connected to the gate node of the first transistor.

4. The output driver of claim 3,
    wherein the controllable switch has at least a first and a second switching state,
    wherein the controllable switch is configured such that, in the first switching state, the voltage level below the voltage level of the supply voltage is applied to the gate node of the first transistor, and, in the second switching state, the voltage level of the supply voltage is applied to the gate node of the first transistor.

5. The output driver of claim 4, comprising:
    a controller to control the first and the second switching state of the controllable switch in dependence on operating the output driver in the first or the second operation mode.

6. The output driver of claim 5, wherein the controller is configured to control the controllable switch to be switched in the first switching state, when the output driver is operated in the first operation mode, and to be switched in the second switching state, when the output driver is operated in the second operation mode.

7. The output driver of claim 6,
    wherein the controllable switch is configured such that, in the first switching state, the gate node of the first transistor is connected to a node at a voltage level below a voltage level of the supply node, wherein the controllable switch is configured such that, in the second switching state, the gate node of the first transistor is connected to the supply node.

8. The output driver of claim 7, comprising:

a reference node to apply a reference voltage, a current path being arranged between the supply node and the reference node, the current path comprising a current source, a resistor and a diode, wherein the current source is connected to the reference node, wherein the resistor is connected to the current source, wherein the diode is disposed between the supply node and the resistor, wherein the controllable switch is configured such that, in the first switching state, the gate node of the first transistor is connected to the node of the current path between the current source and the resistor.

9. The output driver of claim 1, comprising:

a bulk control circuit to apply a bulk control voltage to a bulk node of the driver transistor, wherein the output driver is operable in a first condition in which the potential at the output node is lower than the supply voltage, and in a second condition in which the potential at the output node is higher than the supply voltage, wherein the bulk control circuit is configured to apply a level of the bulk control voltage to the bulk node of the driver transistor in dependence on operating the output driver in the first and second condition, wherein the gate control circuit is configured to apply the level of a gate control voltage to the gate node of the driver transistor in dependence on operating the output driver in the first and second condition.

10. The output driver of claim 9, comprising:

a detection circuit to detect the first and the second condition of the output driver, wherein the detection circuit is configured to monitor the bulk control voltage.

11. A sensor system, comprising:

an output driver according to claim 1, and a sensor device, wherein the output driver is coupled to the sensor device to amplify an input signal of the sensor device.

12. The sensor system of claim 11, wherein the output driver is embodied as a 3-wire output driver.

13. A digital communication system, comprising:

an IO-link master, and an IO-link device, the IO-link device being coupled to the IO-link master, wherein the IO-link device comprises the sensor system of claim 11, wherein the output driver is configured as a digital communication interface of the IO link device.

* * * * *